(12) United States Patent
Inoue et al.

(10) Patent No.: US 10,673,402 B2
(45) Date of Patent: Jun. 2, 2020

(54) RESONATOR AND RESONANCE DEVICE

(71) Applicant: Murata Manufacturing Co., Ltd., Nagaokakyo-shi, Kyoto-fu (JP)

(72) Inventors: Yoshihisa Inoue, Nagaokakyo (JP); Toshio Nishimura, Nagaokakyo (JP); Keisuke Takeyama, Nagaokakyo (JP); Ryota Kawai, Nagaokakyo (JP); Yuichi Goto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 86 days.

(21) Appl. No.: 16/174,563

(22) Filed: Oct. 30, 2018

(65) Prior Publication Data

US 2019/0074812 A1    Mar. 7, 2019

Related U.S. Application Data

(63) Continuation of application No. PCT/JP2017/005609, filed on Feb. 16, 2017.

(30) Foreign Application Priority Data

May 25, 2016    (JP) .................................. 2016-104354

(51) Int. Cl.
*H03H 9/21* (2006.01)
*H03H 9/02* (2006.01)
(Continued)

(52) U.S. Cl.
CPC ....... *H03H 9/02102* (2013.01); *B81B 3/0072* (2013.01); *H03H 9/02393* (2013.01);
(Continued)

(58) Field of Classification Search
CPC    H03H 9/21; H03H 9/215; H03H 9/17; H03H 9/2468; H03H 9/2473;
(Continued)

(56) References Cited

U.S. PATENT DOCUMENTS 4,320,320 A * 3/1982 Momosaki ............. H03H 9/215
310/312
8,134,283 B2    3/2012 Yamada et al.
(Continued)

FOREIGN PATENT DOCUMENTS

JP    2010220193 A    9/2010
JP    2011223371 A    11/2011
(Continued)

OTHER PUBLICATIONS

International Search Report issued for PCT/JP2017/005609, dated Apr. 11, 2017.
(Continued)

*Primary Examiner* — J. San Martin
(74) *Attorney, Agent, or Firm* — Arent Fox LLP

(57) ABSTRACT

A resonator that includes a base and one or more vibration arms with fixed ends connected to a front end of the base and open ends extending therefrom. Moreover, the vibration arms include first and second electrodes and a piezoelectric film that is disposed therebetween. The resonator further includes a protective film disposed opposing an upper face of the piezoelectric film and sandwiching the first electrode and a temperature characteristics adjusting film formed of a material different from a material of the protective film and that is provided on the fixed end side relative to the center of the vibration arms such that part of the protective film is exposed to a surface.

21 Claims, 11 Drawing Sheets

(51) Int. Cl.
*B81B 3/00* (2006.01)
*H03H 9/10* (2006.01)
*H03H 9/24* (2006.01)
*H03H 9/05* (2006.01)
*H03H 9/13* (2006.01)
*H03H 9/17* (2006.01)
*H03H 9/15* (2006.01)

(52) U.S. Cl.
CPC ...... *H03H 9/02448* (2013.01); *H03H 9/0595* (2013.01); *H03H 9/1014* (2013.01); *H03H 9/1057* (2013.01); *H03H 9/13* (2013.01); *H03H 9/176* (2013.01); *H03H 9/2489* (2013.01); *B81B 2201/0271* (2013.01); *B81C 2203/0109* (2013.01); *H03H 2009/155* (2013.01)

(58) Field of Classification Search
CPC .. H03H 9/1473; H03H 9/2484; H03H 9/2478; H03H 9/2489; H03H 9/2494; H03H 3/04; H03H 2003/026; H03H 2003/0492; B06B 1/00659
See application file for complete search history.

(56) References Cited

U.S. PATENT DOCUMENTS

| | | | |
|---|---|---|---|
| 2010/0207486 A1 | 8/2010 | Yamada et al. | |
| 2012/0025923 A1* | 2/2012 | Takizawa | H03H 9/0552 331/158 |
| 2015/0180449 A1* | 6/2015 | Umeda | H03H 3/0072 310/370 |
| 2016/0197597 A1 | 7/2016 | Yamada et al. | |
| 2018/0175794 A1* | 6/2018 | Yamazaki | H03H 3/0072 |

FOREIGN PATENT DOCUMENTS

| | | |
|---|---|---|
| JP | 2012065293 A | 3/2012 |
| JP | 6100582 B2 * | 3/2017 |
| WO | 2015041152 A1 | 3/2015 |

OTHER PUBLICATIONS

Written Opinion of the International Searching Authority issued for PCT/JP2017/005609, dated Apr. 11, 2017.

* cited by examiner

RESONATOR AND RESONANCE DEVICE

CROSS REFERENCE TO RELATED APPLICATIONS

The present application is a continuation of PCT/JP2017/005609 filed Feb. 16, 2017, which claims priority to Japanese Patent Application No. 2016-104354, filed May 25, 2016, the entire contents of each of which are incorporated herein by reference.

TECHNICAL FIELD

The present disclosure relates to resonators and resonance devices.

BACKGROUND

Resonator, such as a piezoelectric vibrator, are used as devices for achieving a timer function in an electronic apparatus. With miniaturization of electronic apparatuses, a resonator is also required to be miniaturized, and a resonator manufactured using MEMS (Micro Electro Mechanical Systems) technology (hereinafter, also referred to as "MEMS vibrator") has attracted attention.

In the MEMS vibrator, variations in resonant frequency occur due to manufacturing variations in some cases. Therefore, the frequency is adjusted by additional etching or the like during or after the manufacturing of the MEMS vibrator.

For example, Patent Document 1 (identified below) discloses a configuration in which, in a vibrator having a plurality of vibration arms, a resonant frequency is adjusted by respectively reducing a mass portion for coarse adjustment provided at a tip end side of the vibration arm and a mass portion for fine adjustment provided at a base end side of the vibration arm.

Patent Document 1: Japanese Unexamined Patent Application Publication No. 2012-065293.

In the existing method for adjusting a resonant frequency as described in Patent Document 1, a mass portion is irradiated with an energy beam such as an ion beam to adjust a film thickness of the mass portion, so that the resonant frequency is caused to approach a desired value. However, MEMS vibrators have extremely fine structures. Accordingly, when the mass portion is irradiated with the energy beam, a film formed in another region on the MEMS vibrator is affected by the irradiation with the energy beam so that the film thickness thereof also varies. As a result, temperature dependence characteristics of the resonant frequency of the MEMS vibrator may fluctuate.

SUMMARY OF THE INVENTION

In view of the above circumstances, it is an object of the present invention to suppress a fluctuation in temperature characteristics of a resonant frequency in a resonant frequency adjustment process.

Accordingly, a resonator is disclosed according to an exemplary aspect that includes a base; and a vibration arm, one end of which is a fixed end connected to a front end of the base and the other end of which is an open end extended in a direction being distanced from the front end, the vibration arm including a first electrode and a second electrode, and a piezoelectric film that is disposed between the first electrode and the second electrode, has an upper face opposing the first electrode, and vibrates in a predetermined vibration mode when a voltage is applied between the first and second electrodes. Moreover, the resonator further includes a protective film that is disposed opposing the upper face of the piezoelectric film sandwiching the first electrode and is provided extending from the vibration arm to the base; and a temperature characteristics adjusting film formed of a material different from a material of the protective film, wherein the temperature characteristics adjusting film is provided on the fixed end side relative to the center of a plurality of vibration arms in a direction in which the vibration arms extend and at least at one side of the base in such a manner that part of the protective film is exposed to a surface.

According to the exemplary embodiments, in the adjustment process of the resonant frequency, it is possible to suppress a fluctuation in temperature characteristics of the resonant frequency.

DETAILED DESCRIPTION OF EMBODIMENTS

First Exemplary Embodiment

Figure 1:
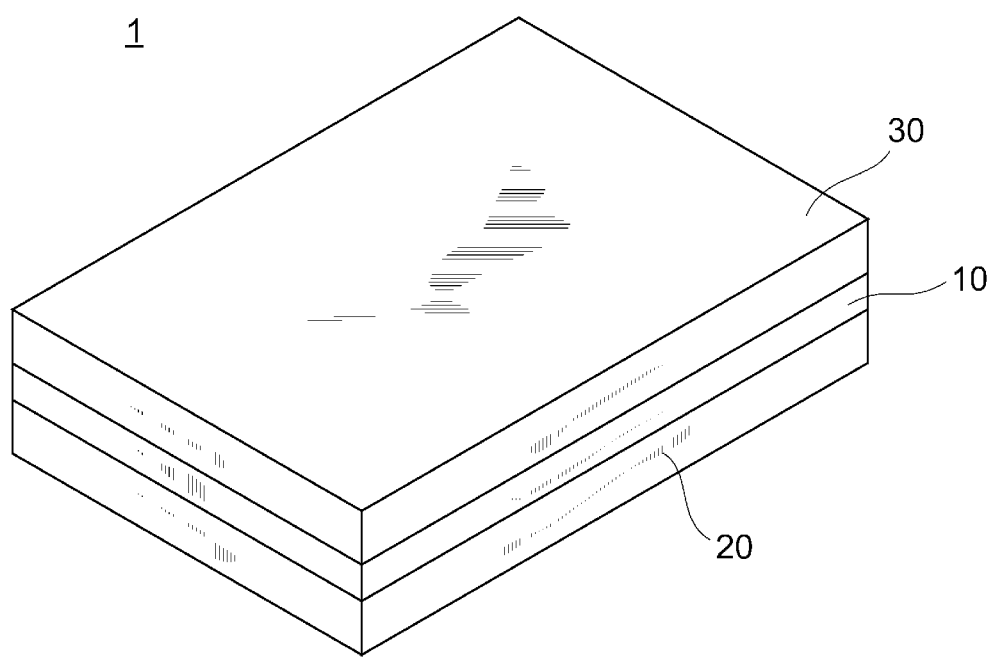
FIG. 1 is a perspective view schematically illustrating an external appearance of a resonance device according to a first exemplary embodiment.
Figure 2:
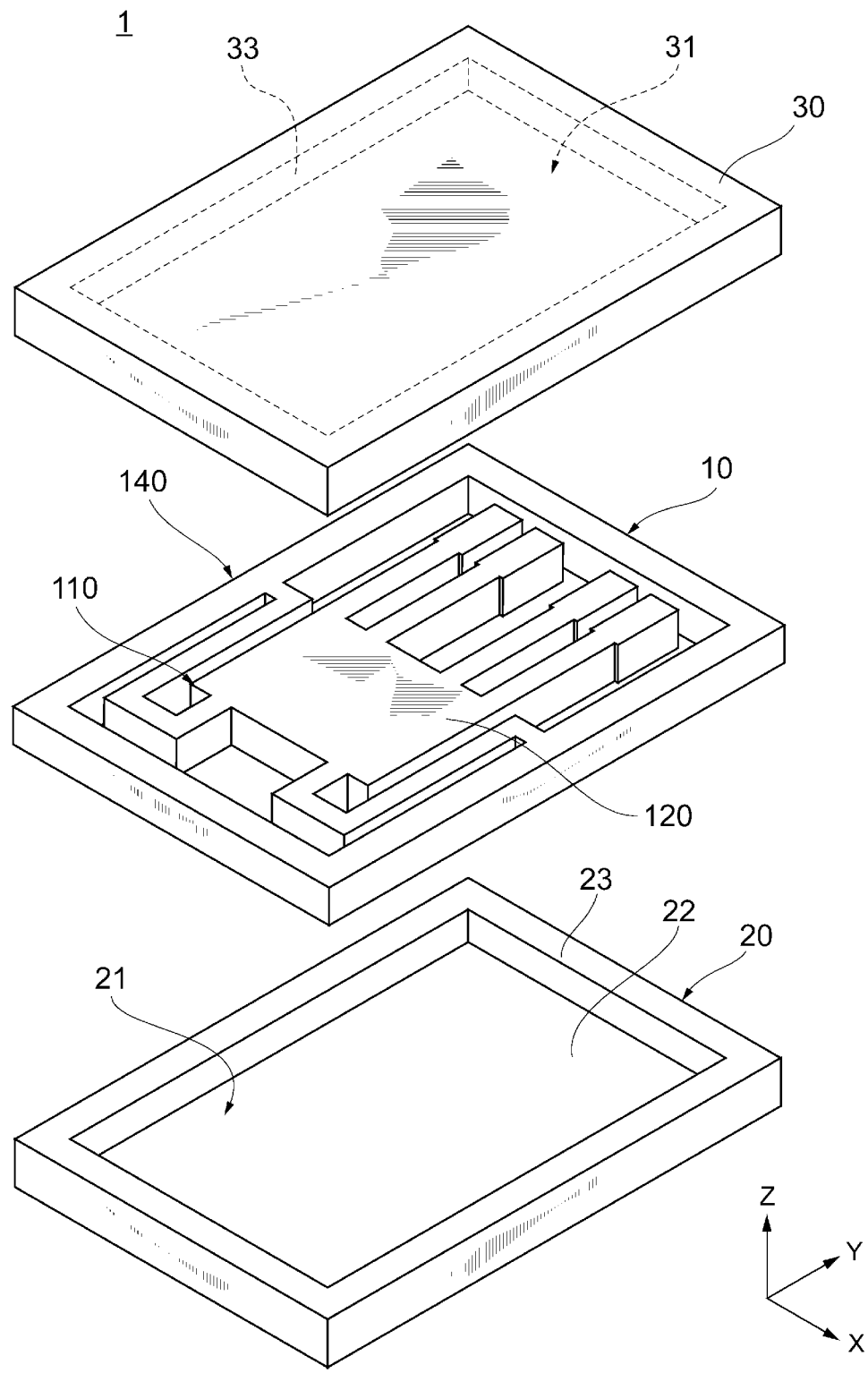
FIG. 2 is an exploded perspective view schematically illustrating a structure of the resonance device according to the first exemplary embodiment.

Hereinafter, a first exemplary embodiment will be described with reference to the accompanying drawings. FIG. 1 is a perspective view schematically illustrating an external appearance of a resonance device 1 according to the first exemplary embodiment. FIG. 2 is an exploded perspective view schematically illustrating a structure of the resonance device 1 according to the first exemplary embodiment.

The resonance device 1 includes a resonator 10, and lid members (an upper lid 30 and a lower lid 20) so provided as to oppose each other sandwiching the resonator 10. In other words, the resonance device 1 is formed in such a manner that the lower lid 20, the resonator 10, and the upper lid 30 are laminated in that order.

Further, the resonator 10, the lower lid 20 and the upper lid 30 are bonded together, whereby the resonator 10 is sealed and a vibration space of the resonator 10 is formed. The resonator 10, the lower lid 20, and the upper lid 30 are each formed using a Si substrate. Then, the resonator 10, and the lower lid 20 and the upper lid 30 are bonded to each other by the Si substrates thereof being bonded to each other. The resonator 10 and the lower lid 20 may be formed using SOI substrates.

According to the exemplary aspect, the resonator 10 is a MEMS resonator manufactured using MEMS technology. In this embodiment, a case in which the resonator 10 is formed using a silicon substrate will be exemplified and explained. Hereinafter, each configuration of the resonance device 1 will be described in detail.

(1. Upper Lid 30)

The upper lid 30 extends in a flat plate shape along an X-Y plane, and a recess 31 having, for example, a flat rectangular parallelepiped shape is formed on a rear surface thereof. The recess 31 is surrounded by a side wall 33 and forms part of the vibration space that is a space in which the resonator 10 vibrates.

(2. Lower Lid 20)

The lower lid 20 has a rectangular plate-shaped bottom plate 22 provided along the X-Y plane and a side wall 23 extending from a peripheral edge of the bottom plate 22 in a Z-axis direction (i.e., in the lamination direction of the lower lid 20 and the resonator 10). On a face of the lower lid 20 opposing the resonator 10, there is provided a recess 21 formed by a surface of the bottom plate 22 and an inner surface of the side wall 23. The recess 21 forms part of the vibration space of the resonator 10. With the above-described upper lid 30 and lower lid 20, this vibration space is hermetically sealed and a vacuum state is maintained. The vibration space may be filled with a gas such as an inert gas.

(3. Resonator 10)

Figure 3:
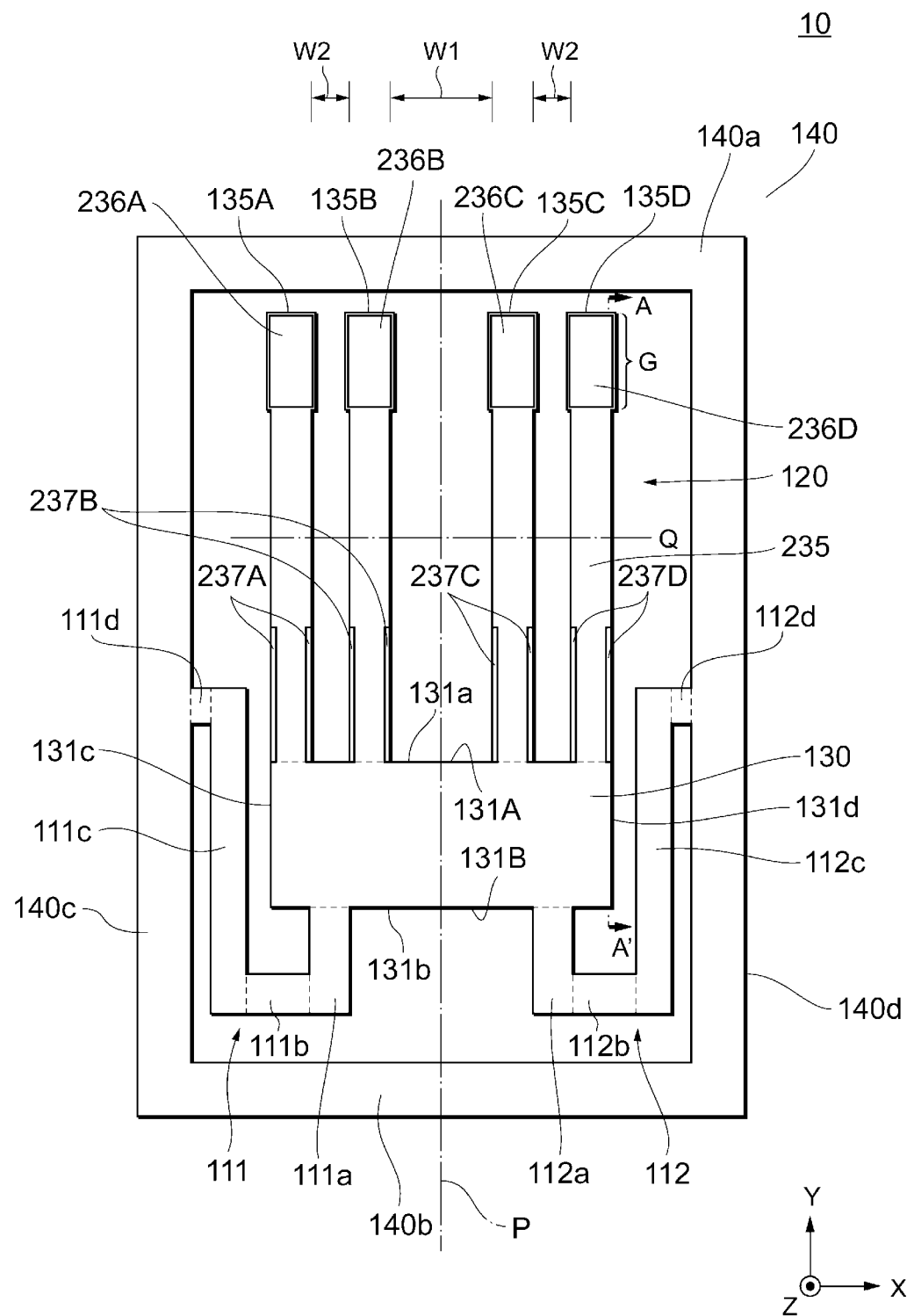
FIG. 3 is a plan view of a resonator according to the first exemplary embodiment, in which an upper-side substrate is removed.

FIG. 3 is a plan view schematically illustrating a structure of the resonator 10 according to the present embodiment. Each configuration of the resonator 10 according to the present embodiment will be described with reference to FIG. 3. The resonator 10 includes a vibration section 120, a holding section 140 (i.e., a frame), and holding arms 111, 112.

(a) Vibration Section 120

The vibration section 120 has a rectangular contour extending along the X-Y plane in an orthogonal coordinate system in FIG. 3. The vibration section 120 is disposed inside the holding section 140, and a space is formed between the vibration section 120 and the holding section 140 at a predetermined interval. In the example of FIG. 3, the vibration section 120 includes a base 130 and four vibration arms 135A to 135D (also collectively referred to as "vibration arms 135"). It is noted that the number of vibration arms is not limited to four, and is set to an arbitrary number equal to or greater than one, for example. In this embodiment, each of the vibration arms 135 and the base 130 are integrally formed.

In a plan view, the base 130 has long sides 131a and 131b in an X-axis direction, and short sides 131c and 131d in a Y-axis direction. The long side 131a is one side of a front end face 131A (hereinafter, also referred to as "front end 131A") of the base 130, and the long side 131b is one side of a rear end face 131B (hereinafter, also referred to as "rear end 131B") of the base 130. In the base 130, the front end 131A and the rear end 131B are so disposed as to oppose each other.

At the front end 131A, the base 130 is connected to the vibration arms 135, which will be described later, and at the rear end 131B, the base 130 is connected to the holding arms 111 and 112, which will be described later. In addition, in the example of FIG. 3, the base 130 has a substantially rectangular shape in a plan view, but the shape is not limited thereto. For example, it is sufficient that the base 130 is formed to be substantially plane-symmetric with respect to an imaginary plane P defined along a perpendicular bisector of the long side 131a. For example, the base 130 may have a trapezoidal shape in which the long side 131b is shorter than the long side 131a, or may have a semicircle shape taking the long side 131a as its diameter. Further, the long sides 131a and 131b and the short sides 131c and 131d are not limited to straight lines, and may be curved lines.

In the base 130, a base length (the length of the short sides 131c and 131d in FIG. 3), which is the longest distance between the front end 131A and the rear end 131B in a direction extending from the front end 131A toward the rear end 131B, is approximately 32 μm. In addition, a base width (the length of the long sides 131a and 131b in FIG. 3), which is the longest distance between the side ends of the base 130 in a width direction orthogonal to the base length direction, is approximately 285 μm.

The vibration arms 135 extend in the Y-axis direction and have the same size. Each of the vibration arms 135 is provided between the base 130 and the holding section 140 in parallel with the Y-axis direction, and one end of the vibration arm 135 is a fixed end connected with the front end 131A of the base 130, while the other end thereof is an open end. Further, the vibration arms 135 are provided in parallel at predetermined intervals in the X-axis direction, respectively. According to an exemplary aspect, the vibration arm 135 has a width of about 50 μm in the X-axis direction and a length of about 420 μm in the Y-axis direction, for example.

In each of the vibration arms 135, a portion distanced, for example, about 150 μm from the open end is wider in the X-axis direction than the other portion of the vibration arm 135. This widened portion is called a weight G. For example, the weight G is wider by 10 μm each at right and left sides along the X-axis direction than the other portion of the vibration arm 135, and the width thereof in the X-axis direction is about 70 μm. The weight G is integrally formed with the vibration arm 135 in the same process. By forming the weight G, the weight per unit length of the vibration arm 135 is heavier on the open end side than on the fixed end side. Accordingly, since each of the vibration arms 135 has the weight G on the open end side thereof, the amplitude of vibrations in an up-down direction of each vibration arm can be increased.

In the vibration section 120 of the present embodiment, two vibration arms 135A and 135D are disposed in outer side portions and two vibration arms 135B and 135C are disposed in inner side portions in the X-axis direction. An interval W1 between the vibration arms 135B and 135C in the X-axis direction is set to be larger than an interval W2 between the vibration arm 135A (135D) in the outer side portion and the vibration arm 135B (135C) in the inner side portion adjacent to the vibration arm 135A (135D) in the outer side portion in the X-axis direction. The interval W1 is, for example, about 35 μm, and the interval W2 is, for example, about 25 μm. By setting the interval W2 smaller than the interval W1, vibration characteristics are improved. Further, in order to reduce the size of the resonance device 1, the interval W1 may be set smaller than the interval W2, or may be set equal to the interval W2.

In the exemplary aspect, a protective film 235 is so formed on a surface of the vibration section 120 (a face opposing the upper lid 30) as to cover the entire surface thereof. On a surface of the protective film 235 at each tip end on the open end side of the vibration arms 135A to 135D, frequency adjusting films 236A to 236D (hereinafter, these films are also collectively referred to as "frequency adjusting films 236") are respectively formed. With the protective film 235 and the frequency adjusting film 236, it is possible to adjust the resonant frequency of the vibration section 120. It is sufficient for the protective film 235 to be formed on at least the vibration arm 135, and it may not be formed on the base 130.

The frequency adjusting film 236 is formed on the protective film 235 in such a manner that the surface thereof is exposed in a region of the vibration section 120 where displacement due to the vibrations is relatively large. Specifically, the frequency adjusting film 236 is formed near the open end of the vibration arm 135. In this embodiment, the frequency adjusting film 236 is formed on the weight G of the vibration arm 135.

Further, on the fixed end side relative to a center Q of the vibration arms 135 in a direction in which the vibration arms 135 extend, temperature characteristics adjusting films 237A to 237D (hereinafter, these films are also collectively referred to as "temperature characteristics adjusting films 237" for purposes of this disclosure) are formed in a partial region on the protective films 235. That is, both the protective film 235 and the temperature characteristics adjusting film 237 are exposed on the fixed end side relative to the center Q of the vibration arm 135.

In the vibration arm 135, a face on which the protective film 235 is formed is defined as a surface, a face opposing the stated surface is defined as a rear surface, and two faces connecting the surface and the rear surface and also connecting the open end and the fixed end are defined as side surfaces. At this time, in this embodiment, on the surface of the vibration arm 135, the temperature characteristics adjusting film 237 is formed, extending from the fixed end of the vibration arm 135 toward the open end thereof, in a region with a length equal to approximately one fourth of the length of the vibration arm 135 in such a manner as to cover two regions extending adjacent to the two side surfaces. In the temperature characteristics adjusting film 237, a width along the X-axis direction is about 2 µm and a length along the Y-axis direction is about 100 µm.

On the vibration arm 135, the protective film 235 is exposed on the entire surface of a region other than the regions where the frequency adjusting film 236 and the temperature characteristics adjusting film 237 are exposed.

(b) Holding Section 140

The holding section 140 (i.e., the frame) is formed in a rectangular frame shape along the X-Y plane. The holding section 140 is so provided as to surround an outer side portion of the vibration section 120 along the X-Y plane in a plan view. It is sufficient that the holding section 140 is provided in at least part of the periphery of the vibration section 120, and the shape is not limited to a frame-like shape. For example, it is sufficient that the holding section 140 is provided around the vibration section 120 in such a level as to hold the vibration section 120 and to be capable of being bonded with the upper lid 30 and the lower lid 20.

In this embodiment, the holding section 140 comprises a plurality of prism-shaped frame bodies 140a to 140d that are integrally formed. As illustrated in FIG. 3, the frame body 140a is disposed so that the longitudinal direction thereof is parallel to the X-axis while opposing the open end of the vibration arm 135. The frame body 140b is disposed so that the longitudinal direction thereof is parallel to the X-axis while opposing the rear end 131B of the base 130. The frame body 140c is disposed so that the longitudinal direction thereof is parallel to the Y-axis while opposing a side end (short side 131c) of the base 130 and the vibration arm 135A, and is connected to one end of each of the frame bodies 140a and 140b at both ends thereof. The frame body 140d is provided so that the longitudinal direction thereof is parallel to the Y-axis while opposing a side end (short side 131d) of the base 130 and the vibration arm 135D, and is connected to the other end of each of the frame bodies 140a and 140b at both ends thereof.

In this embodiment, the holding section 140 is described as being covered with the protective film 235. However, the exemplary embodiment is so not limited thereto, and the protective film 235 may not be formed on the surface of the holding section 140 in an alternative aspect.

(c) Holding Arms 111, 112

The holding arm 111 and the holding arm 112 are provided inside the holding section 140, and connect the rear end 131B of the base 130 and the frame bodies 140c and 140d. As illustrated in FIG. 3, the holding arm 111 and the holding arm 112 are so formed as to be substantially plane-symmetric with respect to the imaginary plane P defined in parallel to a Y-Z plane along the center line in the X-axis direction of the base 130.

The holding arm 111 has arms 111a, 111b, 111c, and 111d. One end of the holding arm 111 is connected to the rear end 131B of the base 130, from which the holding arm 111 extends toward the frame body 140b. Then, the holding arm 111 bends in a direction toward the frame body 140c (that is, in the X-axis direction), bends in a direction toward the frame body 140a (that is, in the Y-axis direction), and bends in the direction toward the frame body 140c again (that is, in the X-axis direction). As such, the other end of the holding arm 111 is connected to the frame body 140c.

The arm 111a is provided between the base 130 and the frame body 140b while opposing the frame body 140c in such a manner that the longitudinal direction thereof is parallel to the Y-axis. One end of the arm 111a is connected to the base 130 at the rear end 131B, from which the arm 111a extends in a direction substantially perpendicular to the rear end 131B, i.e., in the Y-axis direction. An axis passing through the center in the X-axis direction of the arm 111a is preferably disposed inside the center line of the vibration arm 135A, and in the example of FIG. 3, the arm 111a is provided between the vibration arms 135A and 135B. Further, the other end of the arm 111a is connected, at a side surface thereof, to one end of the arm 111b. The arm 111a has a width of about 20 µm defined in the X-axis direction and a length of about 25 µm defined in the Y-axis direction.

The arm 111b is provided between the base 130 and the frame body 140b while opposing the frame body 140b in such a manner that the longitudinal direction thereof is parallel to the X-axis direction. One end of the arm 111b is connected to the side surface of the arm 111a on the side opposing the frame body 140c, which is the other end of the arm 111a, and from which the arm 111b extends in a direction substantially perpendicular to the arm 111a, i.e., in the X-axis direction. Further, the other end of the arm 111b is connected to a side surface of the arm 111c on the side opposing the vibration section 120, which is one end of the arm 111c. The arm 111b has, for example, a width of about 20 µm defined in the Y-axis direction and a length of about 92 µm defined in the X-axis direction.

The arm 111c is provided between the base 130 and the frame body 140c while opposing the frame body 140c in such a manner that the longitudinal direction thereof is parallel to the Y-axis direction. One end of the arm 111c is connected, at its side surface, to the other end of the arm 111b, and the other end thereof is connected to a side surface of the arm 111d on the frame body 140c side, which is one end of the arm 111d. For example, the arm 111c has a width of about 20 µm defined in the X-axis direction and a length of about 255 µm defined in the Y-axis direction.

The arm 111d is provided between the base 130 and the frame body 140c while opposing the frame body 140a in such a manner that the longitudinal direction thereof is parallel to the X-axis direction. One end of the arm 111d is connected to the side surface of the arm 111c on the side opposing the frame body 140c, which is the other end of the arm 111c. Further, the other end of the arm 111d is connected to the frame body 140c at a position opposing the vicinity of a connecting point between the vibration arm 135A and the base 130, and the arm 111d extends therefrom in a direction substantially perpendicular to the frame body 140c, that is, in the X-axis direction. For example, the arm 111d has a width of about 50 µm defined in the Y-axis direction and a length of about 5 µm defined in the X-axis direction.

As described above, the holding arm 111 is connected to the base 130 at the arm 111a, is bent at the connecting point between the arm 111a and the arm 111b, the connecting point between the arm 111b and the arm 111c, and the connecting point between the arms 111c and 111d, and then is connected to the holding section 140.

The holding arm 112 has arms 112a, 112b, 112c, and 112d. One end of the holding arm 112 is connected to the rear end 131B of the base 130, from which the holding arm 112 extends toward the frame body 140b. Then, the holding arm 112 bends in a direction toward the frame body 140d (that is, in the X-axis direction), bends in a direction toward the frame body 140a (that is, in the Y-axis direction), and bends in the direction toward the frame body 140d again (that is, in the X-axis direction); consequently, the other end of the holding arm 112 is connected to the frame body 140d.

Note that the configurations of the arms 112a, 112b, 112c, and 112d are symmetrical with respect to the configurations of the arms 111a, 111b, 111c, and 111d, respectively, and therefore detailed description thereof will be omitted.

(4. Laminated Structure)

Figure 4:
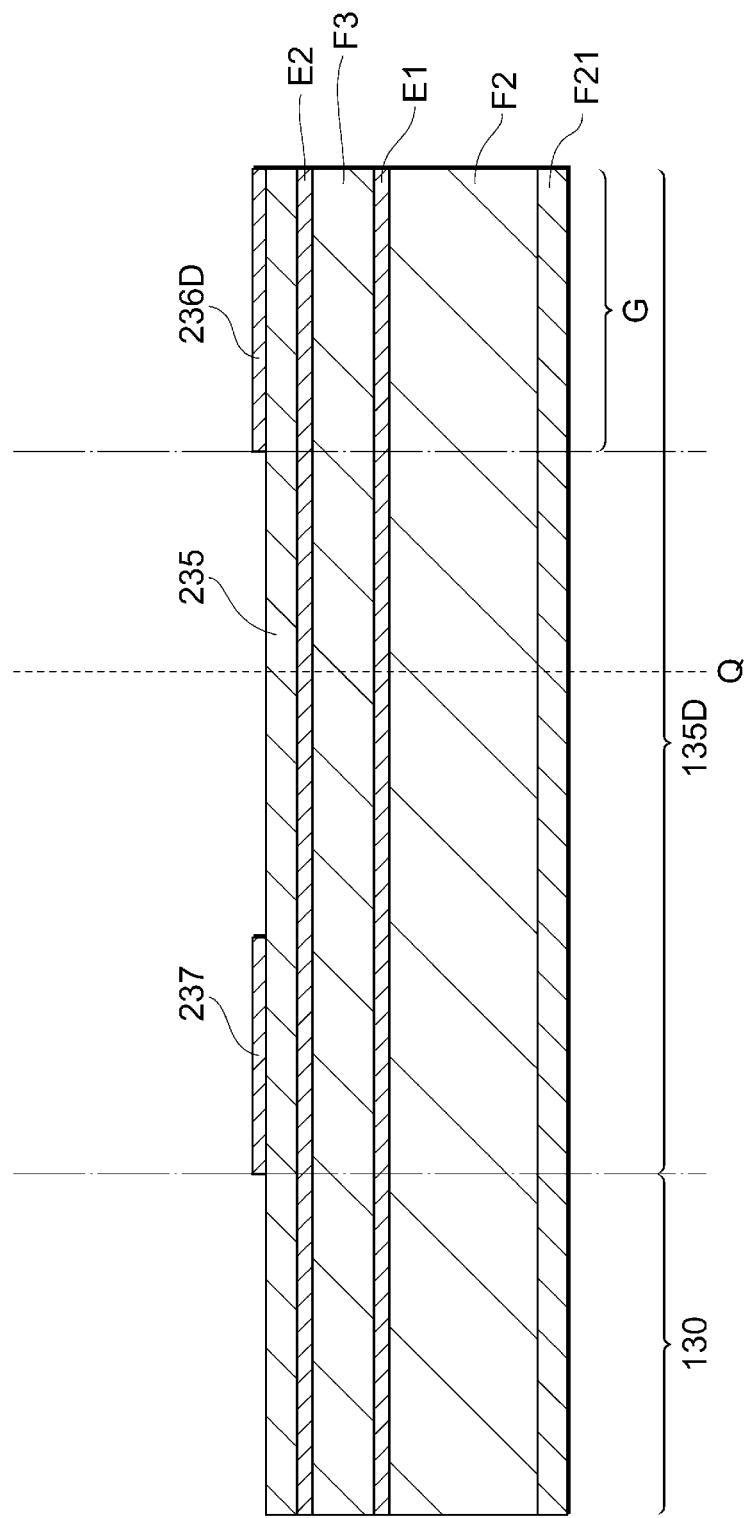
FIG. 4 is a cross-sectional view taken along a line A-A' in FIG. 3.

With reference to FIG. 4, a laminated structure of the resonator 10 will be described exemplifying the vibration arm 135D and the base 130. FIG. 4 is a general view schematically illustrating a cross section taken along a line A-A' in FIG. 3.

In the resonator 10, the holding section 140, the base 130, the vibration arms 135, and the holding arms 111, 112 are integrally formed in the same process. In the resonator 10, first, a metal layer E1 (an example of a second electrode) is laminated on a Si (silicon) substrate F2. Then, a piezoelectric thin film F3 (an example of a piezoelectric film) is so laminated on the metal layer E1 as to cover the metal layer E1. Further, on a surface of the piezoelectric thin film F3, a metal layer E2 (an example of a first electrode) is laminated. The protective film 235 is so laminated on the metal layer E2 as to cover the metal layer E2. In the vicinity of the open end of the vibration arm 135 (weight G), the frequency adjusting film 236 is further laminated opposing the upper face of the piezoelectric thin film F3 with the protective film 235 interposed therebetween. In addition, the temperature characteristics adjusting film 237 made of a material different from that of the protective film 235 and provided opposing the upper face of the piezoelectric thin film F3 with the protective film 235 interposed therebetween, is laminated in part of a region on the fixed end side relative to the center Q of the vibration arm 135.

According to an exemplary aspect, the Si substrate F2 is formed of, for example, a degenerated n-type Si semiconductor having a thickness of about 5 µm, and may include P (phosphorus), As (arsenic), Sb (antimony), or the like as an n-type dopant. In particular, it is desirable that a rotation angle formed by the vibration arm 135 and a [100] crystal axis of the Si substrate F2 made of the n-type Si semiconductor or a crystal axis equivalent thereto falls within a range from greater than zero degree to equal to or smaller than 15 degrees (or from equal to or greater than zero degree to equal to or smaller than 15 degrees), or within a range from equal to or greater than 75 degrees to equal to or smaller than 90 degrees. Here, the rotation angle refers to an angle of a direction in which the holding arms 111 and 112 extends with respect to a line segment along the [100] crystal axis of the Si substrate F2 or a crystal axis equivalent thereto. Further, the resistance value of the degenerate Si used for the Si substrate F2 is, for example, less than 16 mΩ·cm, and more preferably, equal to or less than 1.2 mΩ·cm. Further, on a lower face of the Si substrate F2, a silicon oxide (e.g., $SiO_2$) layer F21 (temperature characteristics correction layer) with a thickness of about 380 nm is formed. With this, temperature characteristics can be improved. In the case where degenerated silicon is used for the Si substrate, the Si substrate F2 can be substituted for the metal layer E1, thereby making it possible to obtain a thinner layer.

In this embodiment, the temperature characteristics correction layer refers to a layer having a function of reducing a temperature coefficient (i.e., a change rate per temperature) of frequency at the vibration section at least near a room temperature in a case where the temperature correction layer is formed on the Si substrate F2, in comparison with a case where the temperature characteristics correction layer is not formed on the Si substrate F2. Since the vibration section 120 includes the temperature characteristics correction layer, it is possible to reduce a change in the resonant frequency, due to the temperature change, of the laminated structure including the Si substrate F2, the metal layers E1 and E2, the piezoelectric thin film F3, and the silicon oxide layer (temperature correction layer) F21, for example.

In the resonator 10, it is desirable that the silicon oxide layer F21 is formed with a uniform thickness. For purposes of this disclosure, it is noted that a uniform thickness is considered to mean that a variation in thickness of the silicon oxide layer F21 falls within a range of ±20% from the average thickness value.

It is further noted that the silicon oxide layer F21 may be formed on the upper face of the Si substrate F2, or on both the upper face and the lower face of the Si substrate F2. In addition, in the holding section 140, the silicon oxide layer F21 may not be formed on the lower face of the Si substrate F2.

The metal layers E2 and E1 are each formed using, for example, Mo (molybdenum), aluminum (Al), or the like having a thickness of equal to or greater than about 0.1 µm and equal to or smaller than about 0.2 µm. The metal layers E2 and E1 are formed into a desired shape by etching or the like. The metal layer E1 is so formed as to function as a lower electrode on the vibration section 120, for example. Further, on the holding arms 111 and 112, the holding section 140, and the like, the metal layer E1 is so formed as to function as wiring for connecting the lower electrode to an AC power supply provided at the outside of the resonator 10.

On the other hand, the metal layer E2 is so formed as to function as an upper electrode on the vibration section 120. Further, on the holding arms 111 and 112, the holding section 140, and the like, the metal layer E2 is so formed as to function as wiring for connecting the upper electrode to a circuit provided at the outside of the resonator 10.

In order to connect the AC power supply to the lower wiring or the upper wiring, a configuration in which an electrode is formed on an outer surface of the upper lid 30, and the stated electrode connects the circuit and the lower wiring or the upper wiring, a configuration in which a via is formed in the upper lid 30, the interior of the via is filled with a conductive material to provide a wiring, and the stated wiring connects the AC power supply to the lower wiring or the upper wiring, or the like may be employed.

The piezoelectric thin film F3 is a thin film of piezoelectric material configured to convert an applied voltage into vibrations, and may contain, as a main ingredient, nitride such as AlN (aluminum nitride), oxide, or the like. Specifically, the piezoelectric thin film F3 can be formed of ScAlN (scandium aluminum nitride). In ScAlN, part of aluminum in aluminum nitride is replaced with scandium. The piezoelectric thin film F3 is, for example, about 0.81 μm in thickness.

The piezoelectric thin film F3 expands and contracts in an in-plane direction of the X-Y plane, i.e., in the Y-axis direction, in accordance with an electric field applied to the piezoelectric thin film F3 by the metal layers E2 and E1. Due to the expansion and contraction of the piezoelectric thin film F3, the vibration arm 135 displaces its free end toward the inner surfaces of the lower lid 20 and the upper lid 30, and vibrates in an out-of-plane bending vibration mode.

According to the exemplary aspect, the protective film 235 is formed of a material whose mass reduction rate by etching is slower than that of the frequency adjusting film 236. Specifically, the protective film 235 may be formed of a nitride film such as AlN (aluminum nitride) or SiN, an oxide film such as $Ta_2O_5$ (tantalum pentoxide), $SiO_2$ (silicon dioxide) or $Al_2O_3$ (aluminum oxide), or the like. It is noted that the mass reduction rate is expressed by the product of the etching rate (thickness removed per unit time) and the density. The thickness of the protective film 235 is, for example, about 0.2 μm.

The frequency adjusting film 236 is formed on substantially the entire surface of the vibration section 120, and then is formed only in a predetermined region by processing such as etching. The frequency adjusting film 236 is formed of a material whose mass reduction rate due to etching is higher than that of the protective film 235. Specifically, the frequency adjusting film 236 can be formed of a metal such as molybdenum (Mo), tungsten (W), gold (Au), platinum (Pt), nickel (Ni), for example.

In the case where the relationship between the mass reduction rates of the protective film 235 and the frequency adjusting film 236 is the one as described above, the magnitude relationship of etching rates therebetween is arbitrary.

The temperature characteristics adjusting film 237 is formed of a material different from that of the protective film 235. More preferably, the temperature characteristics adjusting film 237 is formed of the same material as that of the frequency adjusting film 236. Specifically, the temperature characteristics adjusting film 237 is formed of molybdenum (Mo), tungsten (W), gold (Au), platinum (Pt), nickel (Ni), aluminum (Al), gold-copper alloy (AlCu), titanium (Ti), copper (Cu) titanium nitride (TiN), or the like.

(5. Function of Resonator)

Referring to FIG. 4, the function of the resonator 10 will be described. In this embodiment, the phase of the electric field applied to the vibration arms 135A and 135D in the outer side portions and the phase of the electric field applied to the vibration arms 135B and 135C in the inner side portions are set to be opposite to each other. Thus, the vibration arms 135A and 135D in the outer side portions and the vibration arms 135B and 135C in the inner side portions are displaced in the opposite directions to each other. For example, when the vibration arms 135A, 135D in the outer side portions displace their free ends toward the inner surface of the upper lid 30, the vibration arms 135B and 135C in the inner side portions displace their free ends toward the inner surface of the lower lid 20.

As a result, in the resonator 10 according to the present embodiment, in the case of antiphase vibration, the vibration arm 135A and the vibration arm 135B vibrate in the opposite directions, that is, in an upward direction and a downward direction about a first central axis extending in parallel to the Y-axis between the vibration arm 135A and the vibration arm 135B illustrated in FIG. 3. Further, the vibration arm 135C and the vibration arm 135D vibrate in opposite directions, that is, in the downward direction and the upward direction about a second central axis extending in parallel to the Y-axis between the vibration arm 135C and the vibration arm 135D. As a result, torsional moments in opposite directions to each other are generated with respect to the first central axis and the second central axis, and bending vibrations occur in the base 130.

(6. Function of Frequency Adjusting Film)

Next, the function of the frequency adjusting film 236 will be described. In the resonance device 1 according to the present embodiment, after the above-discussed resonator 10 is formed, a trimming process of adjusting the film thickness of the frequency adjusting film 236 is carried out.

In the trimming process, first, the resonant frequency of each resonator 10 is measured, and frequency distribution is calculated. Next, based on the calculated frequency distribution, the film thickness of the frequency adjusting film 236 is adjusted. The adjustment of the film thickness of the frequency adjusting film 236 can be performed by, for example, radiating an argon (Ar) ion beam onto the entire surface of the resonator 10 and etching the frequency adjusting film 236. Further, when the film thickness of the frequency adjusting film 236 has been adjusted, it is desirable to clean the resonator 10 and remove the scattered films.

By adjusting the film thickness of the frequency adjusting film 236 through the trimming process as discussed above, it is possible to suppress the variation in frequency among a plurality of resonance devices 1 produced on the same wafer.

(7. Function of Temperature Characteristics Adjusting Film)

Next, the function of the temperature characteristics adjusting film 237 will be described. In the above-described trimming process, when the ion beam is radiated onto the entire surface of the resonator 10, the film thickness of the protective film 235 also varies simultaneously with the film thickness of the frequency adjusting film 236. In particular, temperature dependence of the resonant frequency (TCF: Temperature Coefficient of Frequency) fluctuates as well due to the variation in the film thickness of the protective film 235 formed near the fixed end of the vibration arm 135.

The resonator 10 according to the present embodiment is formed such that both the temperature characteristics adjusting film 237 and the protective film 235 are exposed in the region of the vibration arm 135 on the fixed end side relative to the center Q in the direction in which the vibration arm 135 extends. Accordingly, when the ion beam is radiated in the vicinity of the fixed end of the vibration arm 135, both the thicknesses of the temperature characteristics adjusting film 237 and the protective film 235 will change in the region on the fixed end side relative to the center Q.

Since the temperature characteristics adjusting film 237 and the protective film 235 are films formed of different materials, temperature dependence (TCE: Temperature Coefficient of Elasticity) of the Young's modulus is different from each other. In a case where the film thicknesses of two kinds of films having different TCEs vary, fluctuations in TCF caused by the variations in the film thicknesses can be canceled out each other. As a result, in the resonator 10 according to the present embodiment, it is possible to suppress the fluctuation in TCF in the trimming process.

Favorable combinations of the protective film 235 and the temperature characteristics adjusting film 237 capable of exhibiting above-mentioned effect are as follows, for example: aluminum nitride (AlN) and molybdenum (Mo), aluminum nitride (AlN) and gold (Au), silicon dioxide ($SiO_2$) and molybdenum (Mo), and silicon dioxide ($SiO_2$) and gold (Au). In addition, arbitrary combinations of the following materials can also obtain a similar effect: aluminum nitride (AlN), silicon dioxide ($SiO_2$), silicon nitride (SiN), and aluminum oxide ($Al_2O_3$) to be used as the protective film 235; aluminum (Al), gold-copper alloy (AlCu), molybdenum (Mo), titanium (Ti), copper (Cu), gold (Au), titanium nitride (TiN), or the like to be used as the temperature characteristics adjusting film 237.

(8. Experiment Results)

Results of verifying the function of the temperature characteristics adjusting film 237 will be described with reference to FIGS. 5 to 8. In each of the verifications shown in FIGS. 5 to 8, a simulation was carried out using the FEM (Finite Element Method) with regard to a change in TCF characteristics before and after the trimming process.

First, in FIGS. 5 to 7, as resonators in comparative examples, resonators A,B and C were used as follows in the verification. Note that the resonator of any of the comparative examples had the same structure as that of the resonator 10 according to the present embodiment except for the following configurations.

Figure 5:
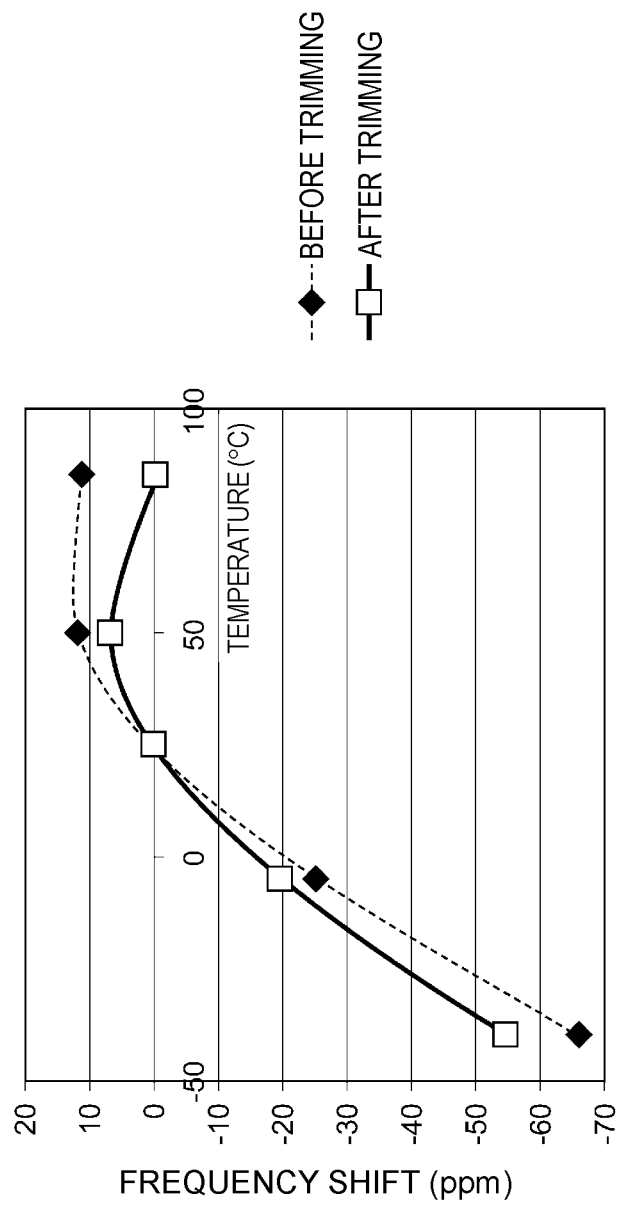
FIG. 5 is a graph showing a simulation result with regard to a resonator of a comparative example.

FIG. 5: the resonator A being configured to include none of the frequency adjusting film 236 and the temperature characteristics adjusting film 237.

Figure 6:
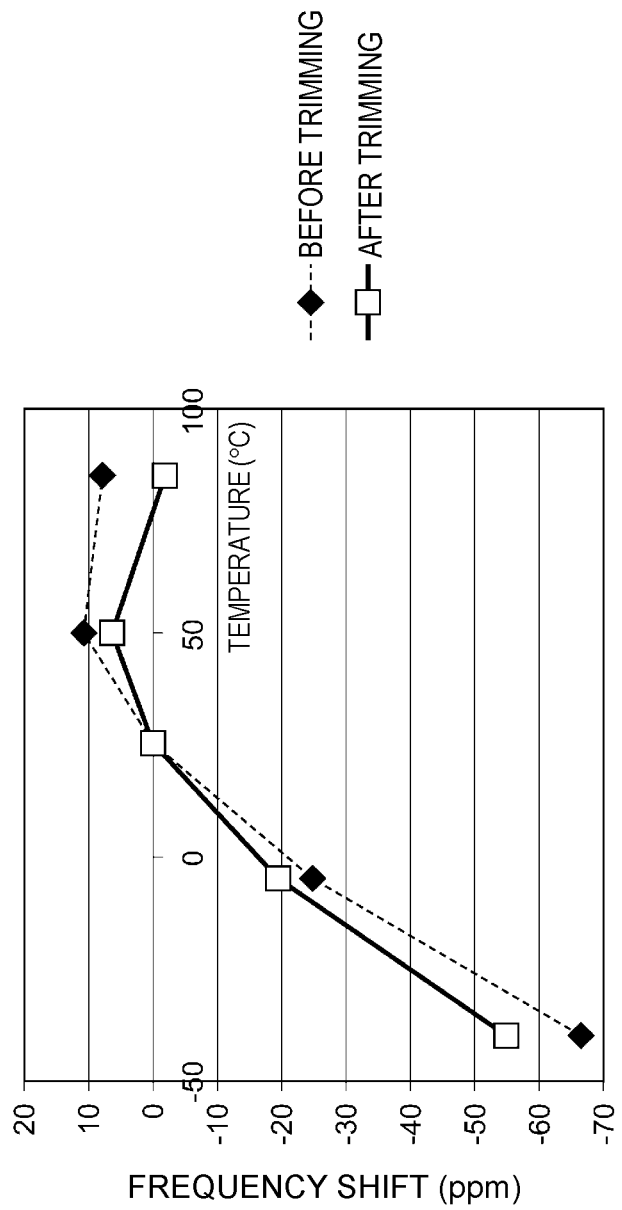
FIG. 6 is a graph showing a simulation result with regard to a resonator of a comparative example.

FIG. 6: the resonator B being configured to include the frequency adjusting film 236 but not to include the temperature characteristics adjusting film 237.

Figure 7:
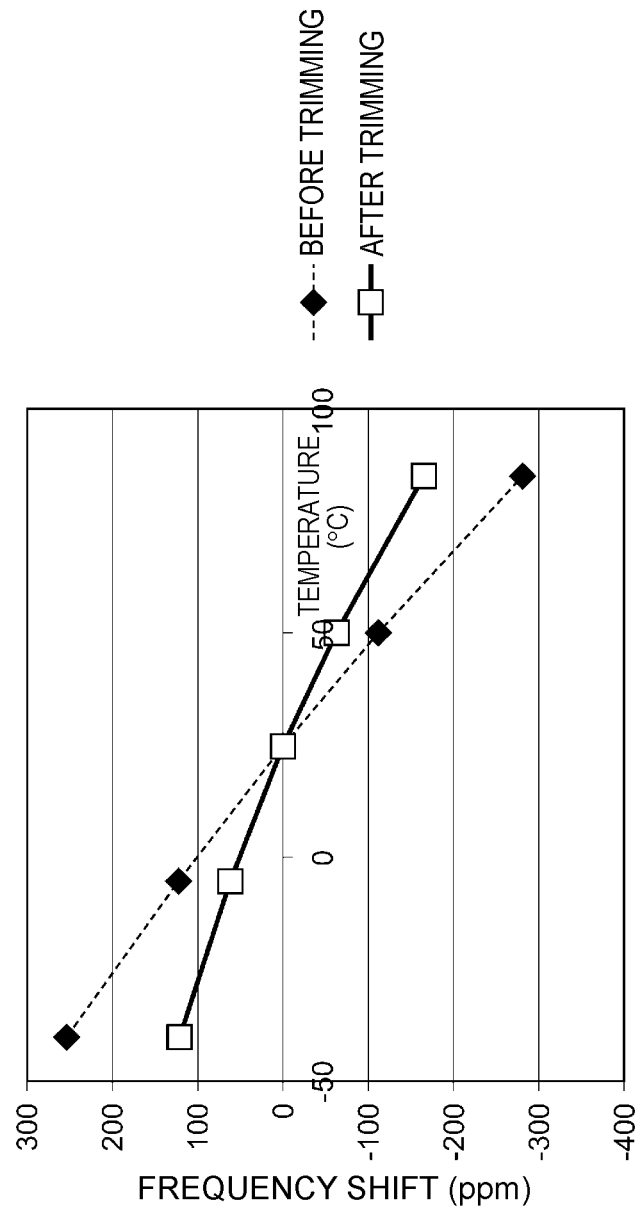
FIG. 7 is a graph showing a simulation result with regard to a resonator of a comparative example.

FIG. 7: a resonator C being configured such that the frequency adjusting film 236 was exposed on the entire surface of the vibration arm 135 while none of the protective film 235 and the temperature characteristics adjusting film 237 were exposed.

As shown in FIG. 5, in the resonator A, the slope of the TCF after the trimming process shifts toward a negative direction compared with the slope of the TCF before the trimming process. Further, as shown in FIG. 6, also in the resonator B, the slope of the TCF after the trimming process shifts toward a negative direction compared with the slope of the TCF before the trimming process. On the other hand, as shown in FIG. 7, in the resonator C, the slope of the TCF after the trimming process shifts toward a positive direction compared with the slope of the TCF before the trimming process.

From the results shown in FIGS. 5 and 6, it is understood that the frequency adjusting film 236 formed near the open end of the vibration arm 135 is hardly effective for suppressing the fluctuation in the TCF. Further, from the results shown in FIGS. 5 and 7, it is understood that the direction toward which the TCF shifts due to the variation in film thickness of the protective film 235 and the direction toward which the TCF shifts due to the variation in film thickness of the temperature characteristics adjusting film 237 are opposite to each other.

Figure 8:
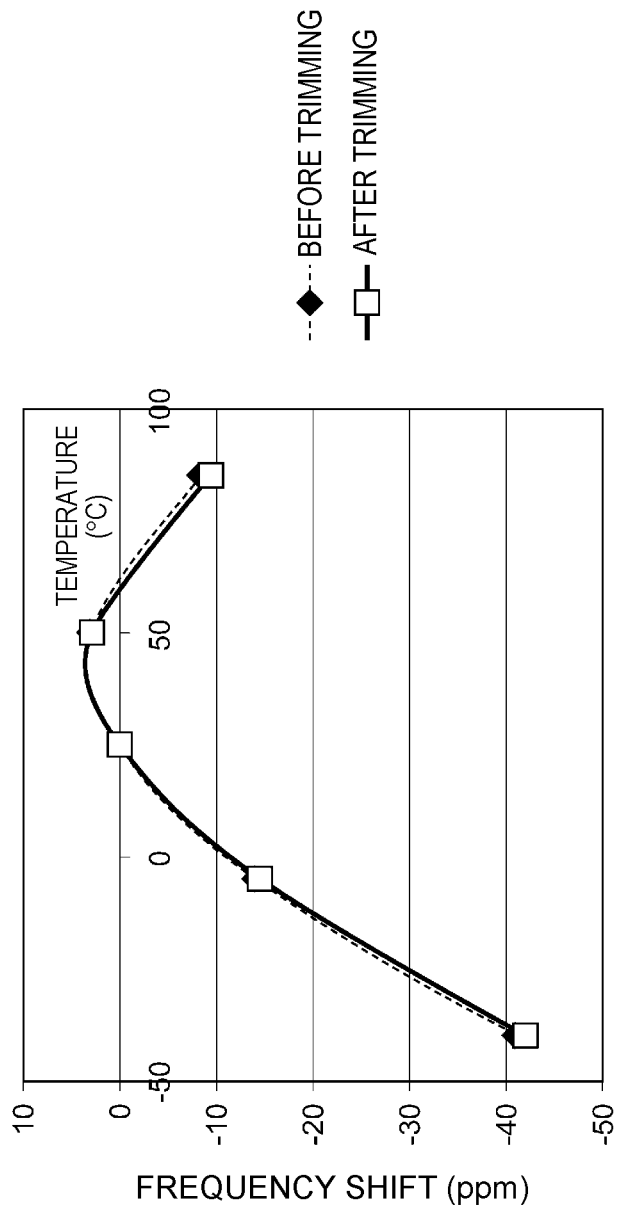
FIG. 8 is a graph showing a simulation result with regard to a resonator according to the first exemplary embodiment.

FIG. 8 is a graph showing a result of the simulation having been carried out on the resonator 10 of the present embodiment. As shown in FIG. 8, in the resonator 10 according to the present embodiment, the curves in the graph respectively showing the TCF before the trimming process and the TCF after the trimming process substantially overlap with each other.

As described above, the resonator 10 according to the present embodiment includes a region in which both the protective film 235 and the temperature characteristics adjusting film 237 are exposed within a region of the vibration arm 135 on the fixed end side relative to the center Q in the direction in which the vibrating arm 135 extends, thereby making it possible to suppress the fluctuation in the TCF due to the trimming process.

Second Embodiment

In a second exemplary embodiment and the embodiments following the second embodiment, description of the same constituent elements as those of the first embodiment will be omitted and only different points therefrom will be explained. In particular, similar operational effects brought by the same configuration will not be referred to in each embodiment.

Figure 9:
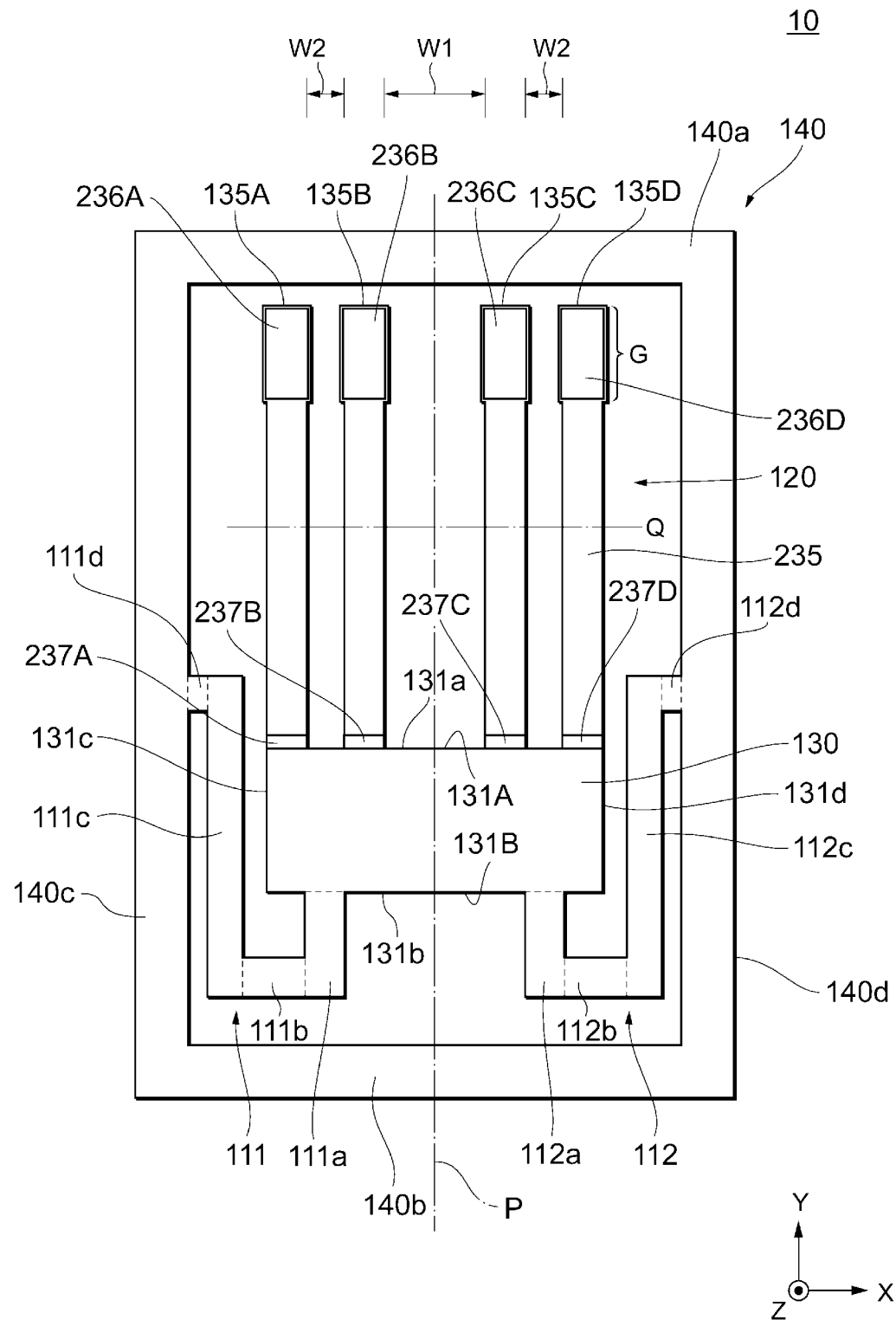
FIG. 9 is a plan view of a resonator according to a second exemplary embodiment invention, in which an upper-side substrate is removed.

FIG. 9 is a plan view schematically illustrating an example of the structure of a resonator 10 according to the present embodiment. Hereinafter, among the detailed configurations of the resonator 10 according to the present embodiment, different points from the first embodiment will be mainly described.

The resonator 10 according to the present embodiment includes a temperature characteristics adjusting film 237, in a region near the fixed end of each vibration arm 135, extending in a direction along the width direction of the vibration arm 135. In the other region of the vibration arm 135 (excluding the weight G), the protective film 235 is exposed.

Other configurations of the resonator 10 are the same as those of the first embodiment.

Third Embodiment

Figure 10:
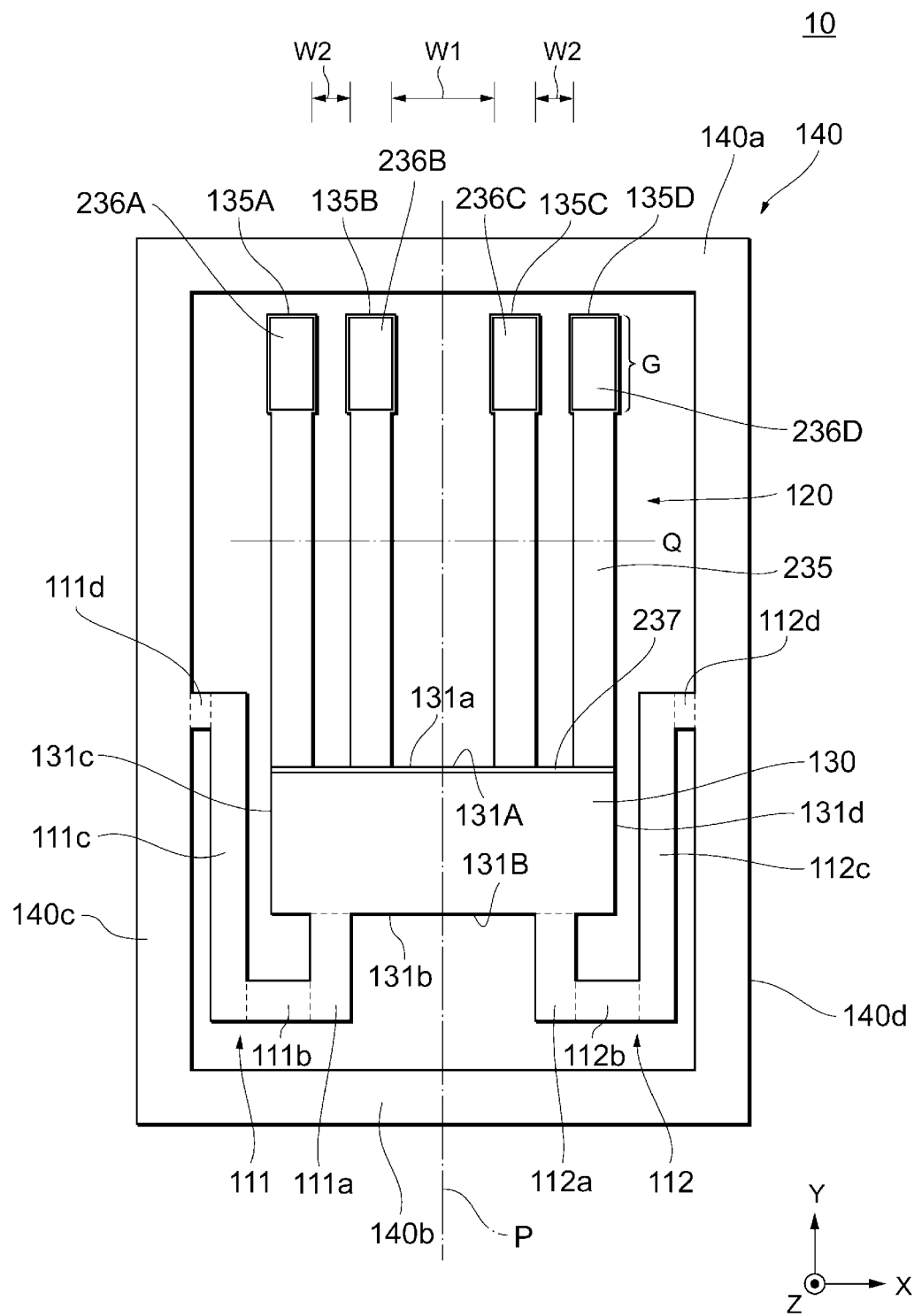
FIG. 10 is a plan view of a resonator according to a third exemplary embodiment, in which an upper-side substrate is removed.

FIG. 10 is a plan view schematically illustrating an example of the structure of a resonator 10 according to the present embodiment. Hereinafter, among the detailed configurations of the resonator 10 according to the present embodiment, different points from the first embodiment will be mainly described.

The resonator 10 according to the present embodiment includes a temperature characteristics adjusting film 237 on a surface of the base 130 (a face opposing the upper lid 30) along a front end 131A. In the other region of the base 130, the protective film 235 is exposed.

Other configurations of the resonator 10 are the same as those of the first embodiment.

Fourth Embodiment

Figure 11:
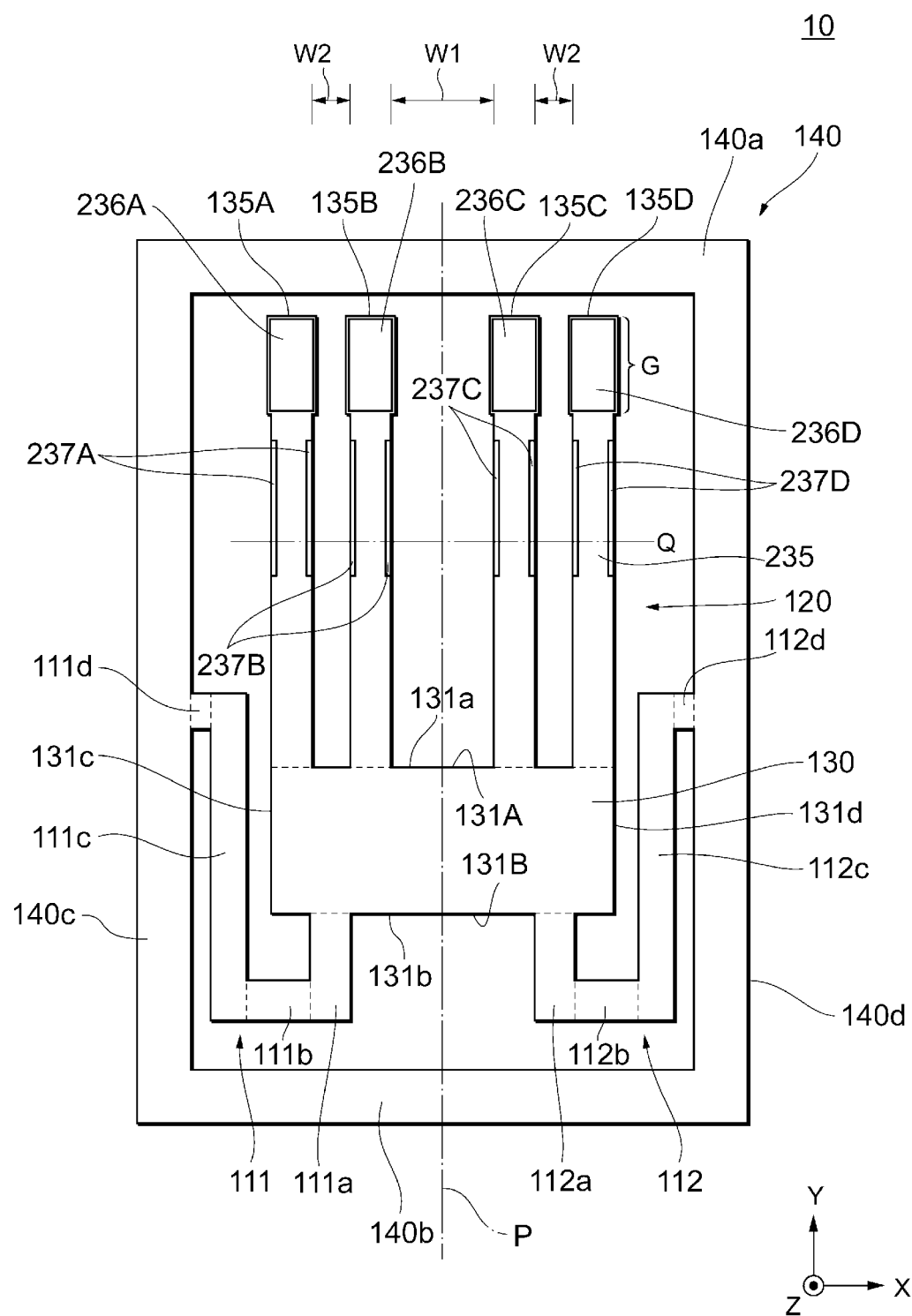
FIG. 11 is a plan view of a resonator according to a fourth exemplary embodiment, in which an upper-side substrate is removed.

FIG. 11 is a plan view schematically illustrating an example of the structure of a resonator 10 according to the present embodiment. Hereinafter, among the detailed configurations of the resonator 10 according to the present embodiment, different points from the first embodiment will be mainly described.

The resonator 10 according to the present embodiment includes a temperature characteristics adjusting film 237 near a center Q of the vibration arm 135. To be specific, the resonator 10 includes a region in the vibration arm 135 where both the protective film 235 and the temperature characteristics adjusting film 237 are exposed; the above-mentioned region ranges from a region on the fixed end side relative to the center Q in a direction in which the vibration arm 135 extends through a region on the open end side. That is, the resonator 10 includes the temperature characteristics adjusting film 237 on a surface of the vibration arm 135 from the region on the fixed end side relative to the center Q in the direction in which the vibration arm 135 extends through the region on the open end side in such a manner as to cover each of the two regions extending adjacently to two sides, and in the other regions (excluding the open end side of the weight G), the protective film 235 is exposed.

Other configurations of the resonator 10 are the same as those of the first embodiment.

Thus far, exemplary embodiments of the present invention have been described. The resonator 10 according to an embodiment of the present invention includes: the base 130; the plurality of vibration arms 135, one ends of which are fixed ends connected to the front end 131A of the base 130 and the other ends of which are open ends extended in a direction being distanced from the front end 131A, each of the vibration arms 135 including the metal layer E2 and the metal layer E1, and the piezoelectric thin film F3 that is disposed between the metal layer E2 and the metal layer E1, has an upper face opposing the metal layer E2, and vibrates in a predetermined vibration mode when a voltage is applied between the metal layer E2 and the metal layer E1; the holding section 140 disposed in at least part of the periphery of the base 130 and the vibration arms 135; and the holding arms 111 and 112, one ends of which are connected to the base 130 and the other ends of which are connected to the holding section 140. The resonator 10 further includes: the protective film 235 that is disposed opposing the upper face of the piezoelectric thin film F3 sandwiching the metal layer E2 and is provided extending from the vibration arm 135 to the base 130; and the temperature characteristics adjusting film 237 formed of a material different from a material of the protective film 235, wherein the temperature characteristics adjusting film 237 is provided on the fixed end side relative to the center of the plurality of vibration arms 135 in a direction in which the vibration arms 135 extend and at least at one side of the base 130 in such a manner that part of the protective film 235 is exposed to a surface.

The resonator 10 according to an embodiment of the present invention includes: the base 130, the plurality of vibration arms 135, one ends of which are fixed ends connected to the front end 131A of the base 130 and the other ends of which are open ends extended in a direction being distanced from the front end 131A, each of the vibration arms 135 including the metal layer E2 and the metal layer E1, and the piezoelectric thin film F3 that is disposed between the metal layer E2 and the metal layer E1, has an upper face opposing the metal layer E2, and vibrates in a predetermined vibration mode when a voltage is applied between the metal layer E2 and the metal layer E1; the holding section 140 disposed in at least part of the periphery of the base 130 and the vibration arms 135; and the holding arms 111 and 112, one ends of which are connected to the base 130 and the other ends of which are connected to the holding section 140. The resonator 10 further includes: the protective film 235 that is disposed opposing the upper face of the piezoelectric thin film F3 sandwiching the metal layer E2; and the temperature characteristics adjusting film 237 formed of a material different from a material of the protective film 235, wherein the temperature characteristics adjusting film 237 is provided on the fixed end side relative to the center of the plurality of vibration arms 135 in a direction in which the vibration arms 135 extend in such a manner that part of the protective film 235 is exposed to a surface.

With this, in the resonator 10 according to the present embodiment, it is possible to suppress the fluctuation in TCF in the trimming process.

It is preferable that the frequency adjusting film 236 provided opposing the upper face of the piezoelectric thin film F3 with the protective film 235 interposed therebetween be further included, and that the frequency adjusting film 236 be provided separately from the temperature characteristics adjusting film 237 at a position including the open end of the plurality of vibration arms 135. Further, the frequency adjusting film 236 is made of a material whose mass reduction rate due to etching is higher than that of the protective film 235, and the temperature characteristics adjusting film 237 is made of the same material as that of the frequency adjusting film 236. Thus, with the resonator 10 according to the present embodiment, by adjusting the film thickness of the frequency adjusting film 236 through the trimming process, it is possible to suppress the variation in frequency among the plurality of resonance devices 1 produced on the same wafer.

Further, it is also preferable that the protective film 235 be an insulator and that the temperature characteristics adjusting film 237 be a metal.

The resonance device 1 according to the present embodiment includes the above-discussed resonator 10, lid members for covering the resonator 10, and an outer electrode. Thus, in the resonance device 1 according to the present embodiment, it is possible to suppress the fluctuation in TCF in the trimming process.

Each of the embodiments described above is given for facilitating the understanding of the present invention and is not intended to limit the interpretation of the present invention. The present invention can be modified/improved without departing from the spirit and scope of the invention, and equivalents thereof are also included in the present invention. In other words, in a case that those skilled in the art perform design change on the above-discussed embodiments as desired, those achieved by the design change are also encompassed within the scope of the present invention as long as they include the features of the present invention. For example, the constituent elements, arrangement thereof, materials, conditions, shapes, sizes, and the like included in the above embodiments are not limited to those having been exemplified, and can be appropriately changed. It is needless to say that each of the above embodiments is illustrative and the configurations described in the different embodiments can be partially replaced or combined with each other, and those achieved by doing so are also encompassed within the scope of the present invention as long as they include the features of the present invention.

REFERENCE SIGNS LIST

1 RESONANCE DEVICE
10 RESONATOR
30 UPPER LID
20 LOWER LID
140 HOLDING SECTION
140a-140d FRAME BODY
111, 112 HOLDING ARM
120 VIBRATION SECTION
130 BASE
135A-135D VIBRATION ARM
F2 Si SUBSTRATE
F21 SILICON OXIDE LAYER (TEMPERATURE CHARACTERISTICS CORRECTION LAYER)
235 PROTECTIVE FILM
236 FREQUENCY ADJUSTING FILM
237 TEMPERATURE CHARACTERISTICS ADJUSTING FILM

The invention claimed is:

1. A resonator comprising:
a base;
at least one vibration arm having a fixed end connected to a front end of the base and an open end extending from the front end, the vibration arm including first and second electrodes with a piezoelectric film disposed therebetween and having an upper face opposite the first electrode;
a protective film disposed opposing the upper face of the piezoelectric film and sandwiching the first electrode therebetween; and
a temperature characteristics adjusting film comprising a material different than a material of the protective film and disposed on a fixed end side of the at least one vibration arm relative to a center of the at least one vibration arm, such that a least a portion of the protective film on the at least one vibration arm is exposed to a surface.

2. The resonator according to claim 1, wherein the at least one vibration arm is configured to vibrate in a predetermined vibration mode when a voltage is applied between the first and second electrodes.

3. The resonator according to claim 1, wherein the protective film extends from the fixed end of at least one vibration arm towards the open end.

4. The resonator according to claim 1, further comprising a frequency adjusting film opposing the upper face of the piezoelectric film with the protective film interposed between the frequency adjusting film and the upper face of piezoelectric film.

5. The resonator according to claim 4, wherein the frequency adjusting film is disposed separately from the temperature characteristics adjusting film at a position including the open end of the at least one vibration arm, such that the protective film is exposed between the frequency adjusting film and the temperature characteristics adjusting film.

6. The resonator according to claim 4, wherein the frequency adjusting film comprises a material having mass reduction rate due to etching that is higher than a mass reduction rate of the protective film.

7. The resonator according to claim 6, wherein the temperature characteristics adjusting film comprises a same material as the material of the frequency adjusting film.

8. The resonator according to claim 4, wherein the frequency adjusting film comprises one of molybdenum, tungsten, gold, platinum, and nickel.

9. The resonator according to claim 1, wherein the protective film is an insulator and the temperature characteristics adjusting film is a metal.

10. The resonator according to claim 1, further comprising:
a frame that at least partially surrounds a periphery of the base and the at least one vibration arm, and
a holding arm connecting the base to the holding section.

11. A resonance device comprising:
the resonator according to claim 1;
a lid members configured to cover the resonator; and
an outer electrode.

12. A resonator comprising:
a base;
at least one vibration arm extending from the base and including first and second electrodes with a piezoelectric film disposed therebetween;
a protective film disposed on an outer surface of one of the first and second electrodes; and
a temperature characteristics adjusting film comprising a material different than a material of the protective film, wherein the temperature characteristics adjusting film is disposed on at least one of the base and the at least one vibration arm, such that a least a portion of the protective film disposed on the outer surface of the one of the first and second electrodes is exposed.

13. The resonator according to claim 12, wherein the protective film extends from the base towards an open end of the at least one vibration arm.

14. The resonator according to claim 12, further comprising a frequency adjusting film disposed on at least one of the first and second electrodes of the at least one vibration arm, such that the protective film is interposed between the frequency adjusting film and the one of the first and second electrodes.

15. The resonator according to claim 14, wherein the frequency adjusting film is disposed separately from the temperature characteristics adjusting film at a position including an open end of the at least one vibration arm opposite the base, such that the protective film is exposed between the frequency adjusting film and the temperature characteristics adjusting film.

16. The resonator according to claim 14, wherein the frequency adjusting film comprises a material having mass reduction rate due to etching that is higher than a mass reduction rate of the protective film.

17. The resonator according to claim 16, wherein the temperature characteristics adjusting film comprises a same material as the material of the frequency adjusting film.

18. The resonator according to claim 15, wherein the frequency adjusting film comprises one of molybdenum, tungsten, gold, platinum, and nickel.

19. The resonator according to claim 12, wherein the protective film is an insulator and the temperature characteristics adjusting film is a metal.

20. The resonator according to claim 12, further comprising:
a frame that at least partially surrounds a periphery of the base and the at least one vibration arm, and
a holding arm connecting the base to the holding section.

21. The resonator according to claim 12, wherein the at least one arm comprises a weight disposed on an open end thereof, the weight have a greater width than the at least one arm and having a frequency adjusting film disposed thereon.

\* \* \* \* \*